(12) United States Patent  
McQueen

(10) Patent No.: US 6,835,650 B1  
(45) Date of Patent: Dec. 28, 2004

(54) ESD/EOS PROTECTION STRUCTURE FOR INTEGRATED CIRCUIT DEVICES AND METHODS OF FABRICATING THE SAME

(75) Inventor: Mark McQueen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 445 days.

(21) Appl. No.: 09/640,237

(22) Filed: Aug. 16, 2000

Related U.S. Application Data

(62) Division of application No. 09/146,851, filed on Sep. 3, 1998.

(51) Int. Cl.[7] ......................................... H01L 21/4763
(52) U.S. Cl. ...................... 438/631; 438/633; 438/637
(58) Field of Search ................................ 438/243, 210, 438/237, 631, 633, 637

(56) References Cited

U.S. PATENT DOCUMENTS

| | | | |
|---|---|---|---|
| 4,735,914 A | * 4/1988 | Hendrickson et al. | 438/276 |
| 5,404,041 A | 4/1995 | Diaz et al. | 257/360 |
| 5,406,104 A | 4/1995 | Hirota et al. | |
| 5,466,639 A | * 11/1995 | Ireland | 438/633 |
| 5,581,104 A | 12/1996 | Lowrey et al. | 257/351 |
| 5,600,525 A | 2/1997 | Avery | 361/56 |
| 5,615,073 A | 3/1997 | Fried et al. | 361/56 |
| 5,615,074 A | 3/1997 | Avery | 361/56 |
| 5,623,387 A | 4/1997 | Li et al. | 361/56 |
| 5,640,299 A | 6/1997 | Leach | 361/56 |
| 5,654,574 A | 8/1997 | Williams et al. | 257/355 |
| 5,654,860 A | 8/1997 | Casper et al. | 361/56 |
| 5,656,967 A | 8/1997 | Casper et al. | 327/525 |
| 5,663,082 A | 9/1997 | Lee | 438/234 |
| 5,675,260 A | 10/1997 | Consiglio | 324/763 |
| 5,675,469 A | 10/1997 | Racino et al. | 361/212 |
| 5,677,205 A | 10/1997 | Williams et al. | 438/237 |
| 5,679,593 A | 10/1997 | Miller, Jr. et al. | 438/210 |
| 5,686,751 A | 11/1997 | Wu | 257/356 |
| 5,686,760 A | 11/1997 | Miyakawa | |
| 5,689,396 A | 11/1997 | Lee | 361/111 |
| 5,691,557 A | 11/1997 | Watanabe | 257/357 |
| 5,828,097 A | 10/1998 | Tanigawa | |
| 5,854,127 A | * 12/1998 | Pan | 438/629 |
| 5,914,518 A | * 6/1999 | Nguyen et al. | 257/377 |
| 5,925,917 A | * 7/1999 | Maari | 257/390 |
| 5,929,469 A | * 7/1999 | Mimoto et al. | 257/208 |
| 5,955,781 A | 9/1999 | Joshi et al. | |
| 5,977,583 A | 11/1999 | Hosotani et al. | |
| 5,986,299 A | 11/1999 | Nakamura et al. | |
| 6,018,195 A | * 1/2000 | Takeebuchi | 257/752 |
| 6,034,433 A | 3/2000 | Beatty | |
| 6,051,859 A | * 4/2000 | Hosotani et al. | 257/306 |
| 6,069,383 A | * 5/2000 | Yu | 257/316 |
| 6,075,293 A | 6/2000 | Li et al. | |
| 6,080,666 A | * 6/2000 | Lee et al. | 438/657 |
| 6,081,033 A | * 6/2000 | Clampitt | 257/758 |
| 6,084,304 A | 7/2000 | Huang et al. | |
| 6,090,660 A | * 7/2000 | Noble, Jr. | 438/243 |
| 6,114,211 A | * 9/2000 | Fulford et al. | 438/305 |
| 6,124,189 A | * 9/2000 | Watanabe et al. | 438/586 |
| 6,211,569 B1 | 4/2001 | Lou | |
| 6,277,727 B1 | * 8/2001 | Kuo et al. | 438/618 |
| 6,479,899 B1 | 11/2002 | Fukuda et al. | |

* cited by examiner

Primary Examiner—Paul E Brock, II  
(74) Attorney, Agent, or Firm—TraskBritt

(57) ABSTRACT

Apparatus and methods forming electrostatic discharge and electrical overstress protection devices for integrated circuits wherein such devices include shared electrical contact between source regions and between drain regions for more efficient dissipation of an electrostatic discharge. The devices further include contact plugs and contact lands which render the fabrication of the devices less sensitive to alignment constraint in the formation of contacts for the device.

8 Claims, 19 Drawing Sheets

ESD/EOS PROTECTION STRUCTURE FOR INTEGRATED CIRCUIT DEVICES AND METHODS OF FABRICATING THE SAME

CROSS-REFERENCE TO RELATED APPLICATION

This application is a divisional of application Ser. No. 09/146,851, filed Sep. 3, 1998, pending.

BACKGROUND OF THE INVENTION

1. Field of the Invention

The present invention relates to electrostatic discharge and electrical overstress protection devices and methods of fabricating same. More particularly, the present invention relates to protection devices having charge dissipating structures within the electrostatic discharge and electrical overstress protection devices.

2. State of the Art

Electrostatic discharge (hereinafter "ESD") and electrical overstress (hereinafter "EOS") are two common phenomenon that occur during human or mechanical handling of semiconductor integrated circuitry (hereinafter "IC") devices. The input pins to an IC device are highly sensitive to damage from the voltage spike of an ESD, which can reach potentials in excess of hundreds of volts. If a charge of this magnitude is brought into contact with a pin of an IC device, a large flow of current may surge through the IC device. Although this current surge may be of limited energy and duration, it can cause a breakdown of insulating barriers within the IC device (usually gate oxide insulating barriers of an MOS (metal-oxide-semiconductor) IC device). This breakdown of the insulating barriers within an IC device can result in permanent damage to the IC device and, once damaged, it is impossible to repair the IC device.

All pins of a MOS IC device must be provided with protective circuits to prevent such ESD voltages from damaging the insulating barriers (e.g., gate oxide) therein. The most common ESD protection schemes presently used in MOS IC devices rely on the parasitic bipolar transistors associated with an nMOS (n-channel or negative channel metal-oxide-semiconductor) device. These protective circuits are normally placed between the input and output pads (i.e., pin locations) on a semiconductor chip (which contains the IC device) and the transistor gates to which the input and output pads are electrically connected. With such protective circuits under stress conditions, the dominant current conduction path between the protected pin and ground involves the parasitic bipolar transistor of that nMOS device. This parasitic bipolar transistor operates in the snapback region under pin positive with respect to ground stress events. The dominant failure mechanism found in the NMOS protection device operating in snapback conditions is the onset of second breakdown. Second breakdown is a phenomena that induces thermal runaway in the IC device wherever the reduction of the ESD current is offset by the thermal generation of carriers. Second breakdown is initiated in an IC device under stress, known as electrical overstress or EOS, as a result of self-heating. The peak nMOS device temperature at which second breakdown is initiated is known to increase with the stress current level. The time required for the structure to heat-up to this critical temperature is dependent on the device layout and stress power distributed across the device.

Higher performance, lower cost, increased miniaturization of components, and greater packaging density of IC devices are ongoing goals of the computer industry. The advantage of increased miniaturization of components include: reduced-bulk electronic equipment, improved reliability by reducing the number of solder or plug connections, lower assembly and packaging costs, and improved circuit performance. In pursuit of increased miniaturization, IC devices have been continually redesigned to achieve ever higher degrees of integration, which has reduced the size of the IC device. However, as the dimensions of the IC devices are reduced, the geometry of the circuit elements have also decreased. In MOS IC devices, the gate oxide thickness has decreased to below 10 nanometers (nm), and breakdown voltages are often less than 10 volts. With decreasing geometries of the circuit elements, the failure susceptibility of IC devices to ESD and EOS increases, and, consequently, providing adequate levels of ESD/EOS protection, has become increasingly more difficult.

An exemplary method of fabricating an ESD/EOS protection structure (i.e., transistor) is illustrated in FIGS. 29–38. FIG. 29 illustrates a first intermediate structure 200 in the production of a transistor. This first intermediate structure 200 comprises a semiconductor substrate 202, such as a lightly doped P-type silicon substrate, which has been oxidized to form thick field oxide areas 204 and exposed to an implantation processes to form an n-type source region 206 and an n-type drain region 208. A transistor gate member 212 is formed on the surface of the semiconductor substrate 202 residing on a substrate active area 214 spanned between the source region 206 and the drain region 208. The transistor gate member 212 comprises a lower buffer layer 216 separating a gate conducting layer 218 of the transistor gate member 212 from the semiconductor substrate 202. Transistor insulating spacer members 222 are formed on either side of the transistor gate member 212. A cap insulator 224 is formed on the top of the transistor gate member 212. An insulative barrier layer 226 is disposed over the semiconductor substrate 202, the thick field oxide areas 204, the source region 206, the drain region 208, and the transistor gate member 212.

As shown in FIG. 30, an etch mask 232 is patterned on the surface of the insulative barrier layer 226, such that openings 234 in the etch mask 232 are located substantially over the source region 206 and the drain region 208. The insulative barrier layer 226 is then etched through openings 234 to form vias 236 which expose at least a portion of the source region 206 and the drain region 208, as shown in FIG. 31. The etch mask 232 is then removed, as shown in FIG. 32. A first conductive material 238 is deposited over the insulative barrier layer 226 to fill the vias 236, as shown in FIG. 33. The first conductive material 238 is planarized, as shown in FIG. 34, to electrically separate the first conductive material 238 within each via 236 (see FIG. 33), thereby forming contacts 242. The planarization is usually performed using a mechanical abrasion process, such as chemical mechanical planarization (CMP).

A deposition mask 244 is patterned on the insulative barrier layer 226, having openings 246 over the contacts 242, as shown in FIG. 35. A second conductive material 248 is deposited over the deposition mask 244 to fill the deposition mask openings 246, as shown in FIG. 36. The second conductive material 248 is planarized, as shown in FIG. 37, to electrically separate the second conductive material 248 within each deposition mask opening 246 (see FIG. 35). The planarization is usually performed using a mechanical abrasion, such as a CMP process. The deposition mask 244 is then removed to leave the second conductive material forming a source contact metallization 252 and a drain contact metallization 254, as shown in FIG. 38.

Although methods as described above are used in the industry, it is becoming more difficult to control the proper alignment of the etch mask 232 for the formation of the contacts 242, as tolerances become more and more stringent. For example, as shown in FIGS. 39 and 40, misalignment of the etch mask 232 can occur. Thus, as shown in FIG. 40, when the insulative barrier layer 226 is etched through the misaligned etch mask 232 to form a first via 256 and a second via 258, the etch forming the first via 256 can destroy a portion of the transistor insulating spacer member 222 and/or the cap insulator 224 to expose the gate conducting layer 218 of the transistor gate member 212. Thus, when a conductive material (not shown) is deposited in the first via 256, the gate conducting layer 218 will short, rendering the transistor ineffectual. Furthermore, the misaligned etch mask 232 can also result in the second via 258 exposing a portion of the thick field oxide area 204. However, since the etch to form the second via 258 is generally an oxide insulator-type etch, the etch may also etch through the thick field oxide area 204 to form a third via 262, thereby exposing a portion of the semiconductor substrate 202. Thus, when a conductive material (not shown) is deposited in the second via 258, the conductive material may short with the exposed portion of the semiconductor substrate 202.

Therefore, it would be desirable to design a transistor which can be fabricated with less sensitivity to misalignment and which has a more efficient charge dissipating structure to handle electrostatic discharge and electrical overstress.

BRIEF SUMMARY OF THE INVENTION

The present invention relates to methods of forming electrostatic discharge and electrical overstress protection devices for integrated circuits and devices so formed. The protection devices comprise at least one transistor which includes a shared electrical contact within source regions and within drain regions for more efficient dissipation of an electrostatic discharge which, in turn, reduces the incidence of electrical overstress. The protection devices further include contact plugs and contact landing pads which render the fabrication of such devices less sensitive to alignment constraint in the formation of contacts for the protection device.

An exemplary method of fabrication of the transistor of the present application comprises forming an intermediate structure, including a semiconductor substrate, such as a lightly doped P-type silicon substrate, which has been oxidized to form thick field oxide areas and exposed to n-type implantation processes to form a source region and a drain region. A transistor gate member is formed on the surface of the semiconductor substrate residing on a substrate active area spanned between the source region and the drain region. The transistor gate member comprises a lower buffer layer separating the gate conducting layer of the transistor gate member from the semiconductor substrate. Transistor insulating spacer members, preferably silicon dioxide, are formed on either side of the transistor gate member and a cap insulator is formed on the top of the transistor gate member.

A first barrier layer, preferably tetraethyl orthosilicate (TEOS), is disposed over the semiconductor substrate, the thick field oxide areas, the source region, the drain region, and the transistor gate member. A second barrier layer (preferably made of borophosphosilicate glass (BPSG), borosilicate glass (BSG), phosphosilicate glass (PSG), or the like) is deposited over the first barrier layer. It is, of course, understood that a single barrier layer could be employed. However, a typical barrier configuration is a layer of TEOS over the transistor gate member and the substrate followed by a BPSG layer over the TEOS layer. The TEOS layer is applied to prevent dopant migration. The BPSG layer contains boron and phosphorus which can migrate into the source and drain regions formed on the substrate during inherent device fabrication heating steps. This migration of boron and phosphorus can change the dopant concentrations in the source and drain regions, which can adversely affect the performance of the transistor gate member.

The second barrier layer is then planarized down to the transistor gate member. The planarization is preferably performed using a mechanical abrasion, such as a chemical mechanical planarization (CMP) process. A first etch mask is patterned on the surface of the planarized second barrier layer, such that openings in the first etch mask are located substantially over the source region and the drain region. The first etch mask openings may be of any shape or configuration, including, but not limited to, circles, ovals, rectangles, or even long slots extending over several source regions or drain regions, respectively. The second barrier layer and first barrier layer are then etched to form first vias which expose at least a portion of the source region and the drain region, and the first etch mask is removed. The exposure of the transistor gate member and the etching of such a shallow second barrier layer and first barrier layer allow for easy alignment of the first etch mask which, of course, virtually eliminates the possibility of etching through the insulating material of the transistor gate member to expose and short the gate conducting layer within the transistor gate member. A first conductive material is deposited to fill the first vias. The first conductive material is then planarized to isolate the first conductive material within the first vias, thereby forming contact plugs.

Although any shape of openings in the first etch mask can be used, such as individual openings for each source and drain region, it is preferred that a plurality of transistors are formed in parallel, such that long, slot-type openings in the first etch mask can be formed. The long, slot-type opening, upon etching, forms long, slot vias, which expose multiple source regions or multiple drain regions, respectively. Thus, when the first conductive material is deposited in the first vias, the first conductive material will span multiple source or drain regions and, thereby, dissipate an ESD more efficiently.

A deposition mask is patterned on the second barrier layer, having openings over the contact plugs. The deposition mask openings may be of any shape or configuration, including, but not limited to, circles, ovals, rectangles, or even long slots extending over several source regions and drain regions, respectively. A second conductive material is deposited over the deposition mask to fill the deposition mask openings. The second conductive material is planarized to electrically separate the second conductive material within each deposition mask opening. The planarization is preferably performed using a mechanical abrasion, such as a CMP process. The deposition mask is then removed to leave the second conductive material forming contact lands which are preferably wider than the contact plugs. Again, it is preferred that the contact lands extend over multiple source or drain regions to assist in the dissipation of an ESD.

A third barrier layer (preferably made of borophosphosilicate glass (BPSG), phosphosilicate glass (PSG), or the like) is deposited over the second barrier layer and the contact lands, and, optionally, planarized. A second etch mask is patterned on the third barrier layer, wherein the second etch mask includes openings substantially aligned over the contact lands. The third barrier layer is then etched down to the contact lands to form contact vias. As mentioned above, the contact lands are preferably larger than the contact plugs. The larger contact lands provide a bigger "target" for the etch through the third barrier layer to "hit" the contact lands in the formation of the contact vias. Thus, precise alignment becomes less critical.

The second etch mask is then removed and a third conductive material is deposited over the third barrier layer to fill the contact vias. The third conductive material is then planarized down to the third barrier layer, such as by a CMP method, to electrically isolate the conductive material within each contact via to form upper contacts. A second deposition mask is patterned on the third barrier layer, having openings over the upper contacts. A fourth conductive material is deposited over the deposition mask to fill the deposition mask openings. The fourth conductive material is planarized to electrically separate the fourth conductive material within each deposition mask opening. The planarization is preferably performed using a mechanical abrasion, such as a CMP process. The second deposition mask is then removed to leave the fourth conductive material, forming a source contact metallization and a drain contact metallization, thereby completing the formation of the transistor.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

FIGS. 1–28 illustrate various views of techniques according to the present invention for forming ESD/EOS protection structures. It should be understood that the figures presented in conjunction with this description are not meant to be actual cross-sectional views of any particular portion of an actual semiconductor device, but are merely idealized representations which are employed to more clearly and fully depict the process of the invention than would otherwise be possible. Elements common between the figures maintain the same numeric designation.

Figure 1:
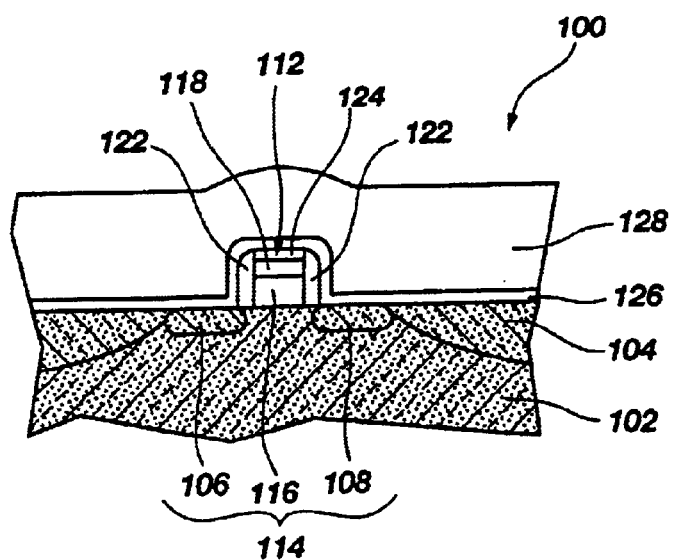
FIG. 1 is a side cross-sectional view of an intermediate structure in a method of forming an ESD/EOS protection structure according to the present invention.

FIG. 1 illustrates a first intermediate structure 100 in the production of a transistor. This first intermediate structure 100 comprises a semiconductor substrate 102, such as a lightly doped P-type silicon substrate, which has been oxidized to form thick field oxide areas 104 and exposed to n-type implantation processes to form a source region 106 and a drain region 108. A transistor gate member 112 is formed on the surface of the semiconductor substrate 102 residing on a substrate active area 114 spanned between the source region 106 and the drain region 108. The transistor gate member 112 comprises a lower buffer layer 116, preferably silicon dioxide, separating a gate conducting layer 118 of the transistor gate member 112 from the semiconductor substrate 102. Transistor insulating spacer members 122, preferably silicon dioxide or silicon nitride, are formed on either side of the transistor gate member 112 and a cap insulator 124, also preferably silicon dioxide or silicon nitride, is formed on the top of the transistor gate member 112.

A first barrier layer 126, preferably tetraethyl orthosilicate (TEOS), is disposed over the semiconductor substrate 102, the thick field oxide areas 104, the source region 106, the drain region 108, and the transistor gate member 112. A second barrier layer 128 (preferably made of borophosphosilicate glass (BPSG), borosilicate glass (BSG), phosphosilicate glass (PSG), or the like) is deposited over the first barrier layer 126.

Figure 2:
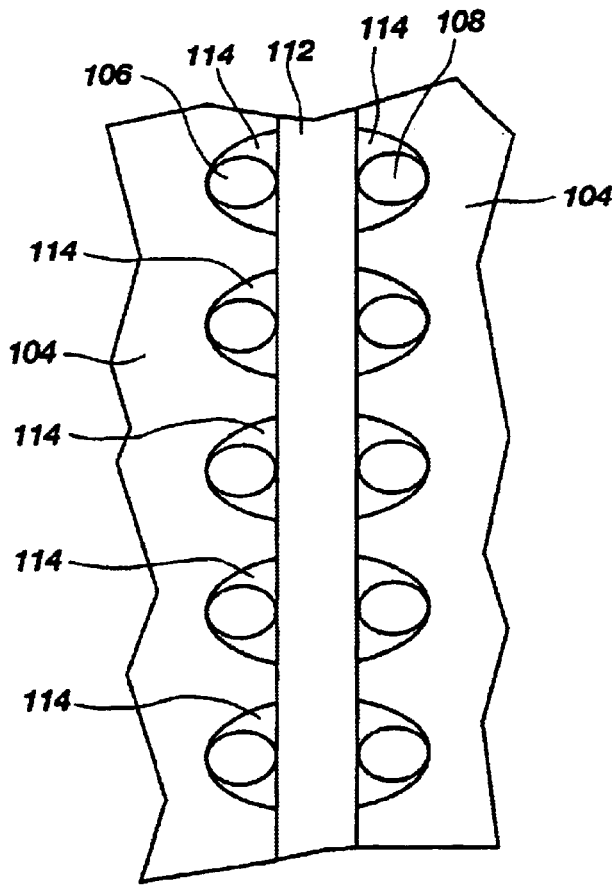
FIG. 2 is a top plan view illustrating a plurality of intermediate structures.

Generally, a plurality of structures are formed in multiple sets on the semiconductor substrate 102. FIG. 2 illustrates a top view of such a plurality of substrate active areas 114 surrounded by the thick field oxide area 104, wherein the substrate active areas 114 include the source regions 106, the drain regions 108, and the transistor gate member 112 spanning and intersecting the substrate active areas 114, prior to the deposition of the first barrier layer 126 and the second barrier layer 128.

Figure 3:
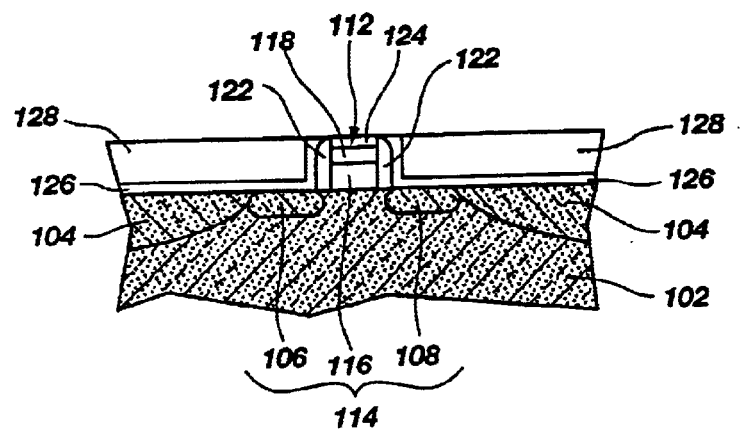
FIG. 3 is a side cross-sectional view of the intermediate structure after planarization of a barrier layer according to the present invention.
Figure 4:
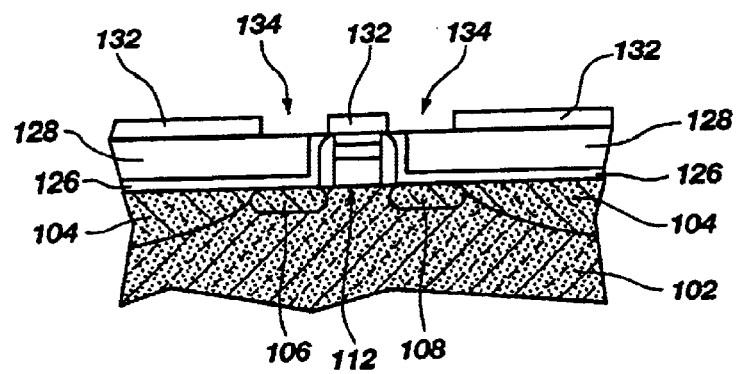
FIG. 4 is a side cross-sectional view of a etch mask patterning over the structure of FIG. 3 according to the present invention.
Figure 5:
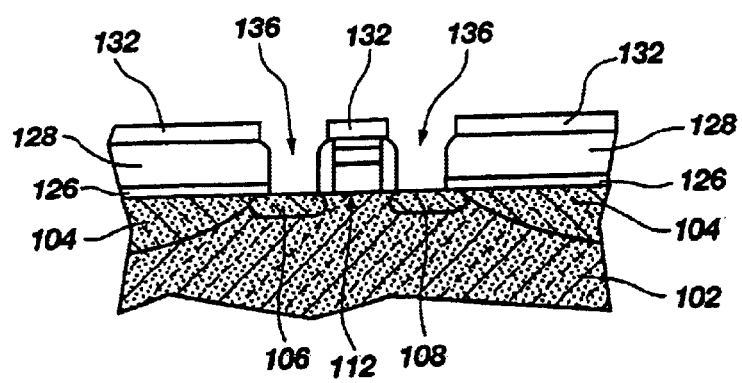
FIG. 5 is a side cross-sectional view of the structure of FIG. 4 after etching according to the present invention.

As shown in FIG. 3, the second barrier layer 128 is then planarized down to the transistor gate member 112. The planarization is preferably performed using a mechanical abrasion, such as a chemical mechanical planarization (CMP) process. As shown in FIG. 4, a first etch mask 132, such as photoresist, is patterned on the surface of the planarized second barrier layer 128, such that openings 134 in the first etch mask 132 are located substantially over the source region 106 and the drain region 108. The etch mask openings 134 may be of any shape or configuration, including, but not limited to, circles, ovals, rectangles, or even long slots extending over several source regions 106 and drain region 108, respectively. The second barrier layer 128 and first barrier layer 126 are then etched to form first vias 136 to expose at least a portion of the source region 106 and the drain region 108, as shown in FIG. 5. The etch mask 132 is then removed to form a second intermediate structure 140, as shown in FIG. 6.

Figure 6:
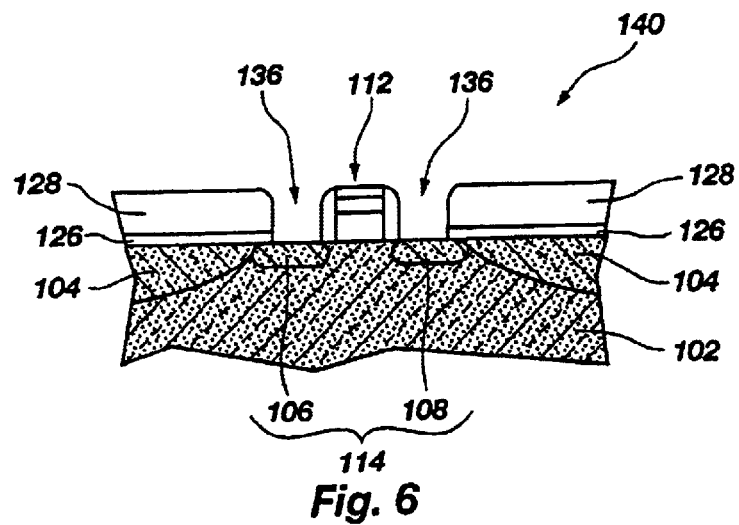
FIG. 6 is a side cross-sectional view of the structure of FIG. 5 after removal of the etch mask according to the present invention.
Figure 7:
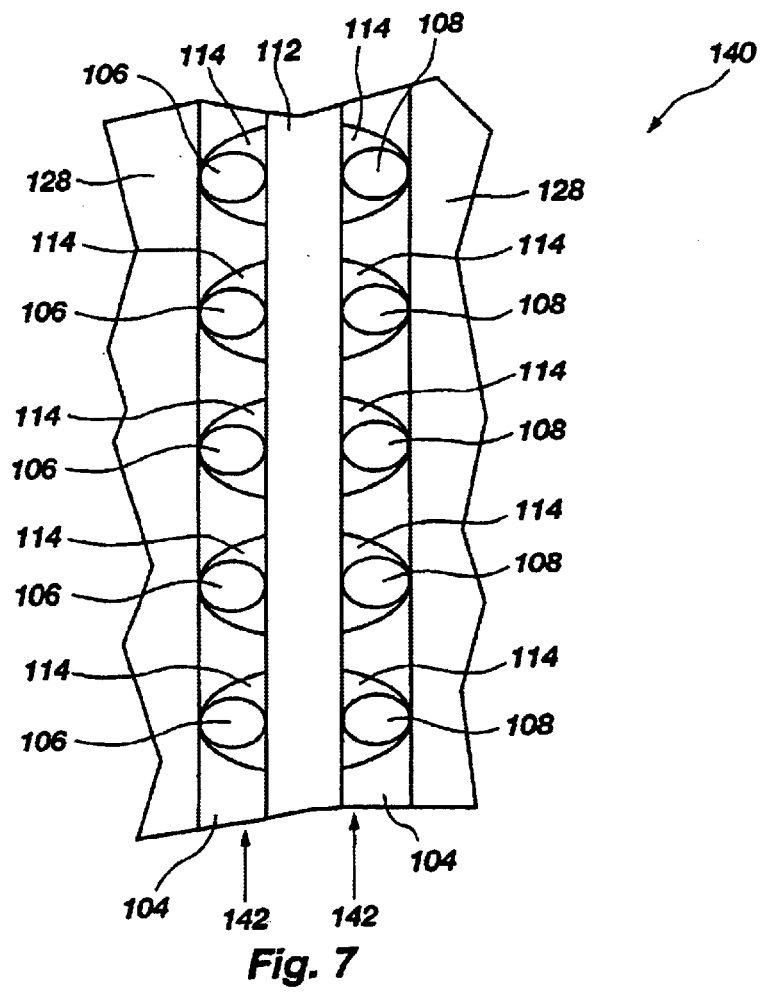
FIG. 7 is a top plan view of the structure of FIG. 6, wherein long, slot-type openings are used to form long, slot vias according to the present invention.
Figure 8:
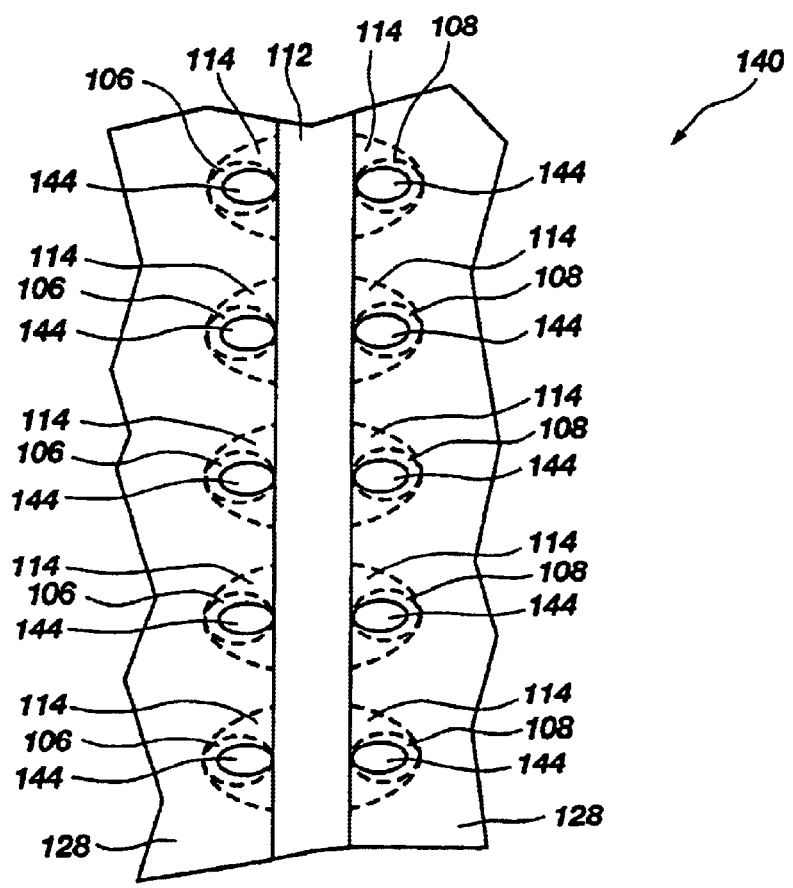
FIG. 8 is a top plan view of the structure of FIG. 6, wherein oval openings over each source and drain region respectively are used to form individual vias according to the present invention.

FIGS. 7 and 8 illustrate top plan views of the second intermediate structure 140 of FIG. 6, wherein different shaped openings 134 of the etch mask 132 (see FIG. 5) were utilized. FIG. 7 is the resulting intermediate structure 140 wherein long, slot-type openings are utilized to form long, slot vias 142 which expose multiple source regions 106 and multiple drain regions 108, respectively. FIG. 8 is a resulting intermediate structure 140 wherein oval openings are utilized to form multiple, individual vias 144 which expose individual source regions 106 and individual drain regions 108 (active areas 114, source regions 106, and drain regions 108 are shown in shadow for visual orientation).

Figure 9:
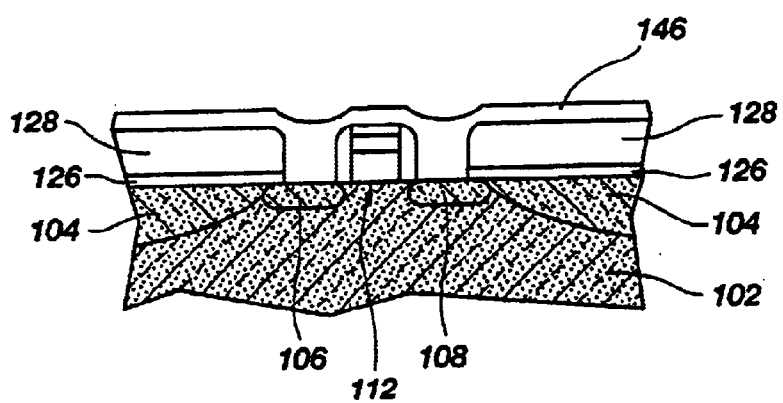
FIG. 9 is a side cross-sectional view of the structure of FIG. 6 after the deposition of a first conductive material to contact source and drain regions according to the present invention.
Figure 10:
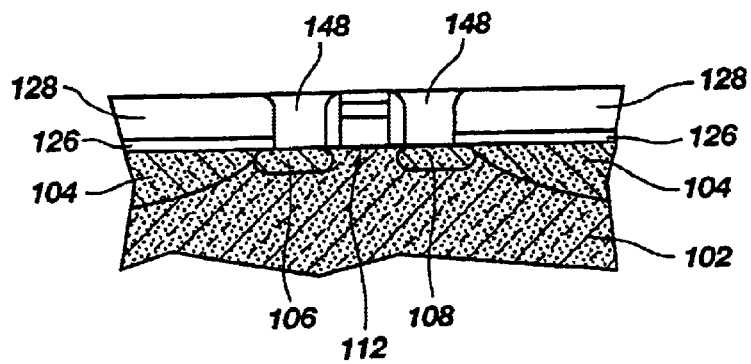
FIG. 10 is a side cross-sectional view of the structure of FIG. 9 after the planarization of the first conductive material according to the present invention.

As shown in FIG. 9, a first conductive material 146, such as n-type doped polysilicon, is deposited such that the first vias 136 are filled therewith. The first conductive material 146 is then planarized to isolate the first conductive material 146 within the first vias 136, thereby forming contact plugs 148, as shown in FIG. 10. Preferably, the first vias 136 are formed as long, slot vias 142, as shown in FIG. 7, as the first conductive material 146 in each slot via will span multiple source or drain regions and, thereby, dissipate an ESD more efficiently.

Figure 11:
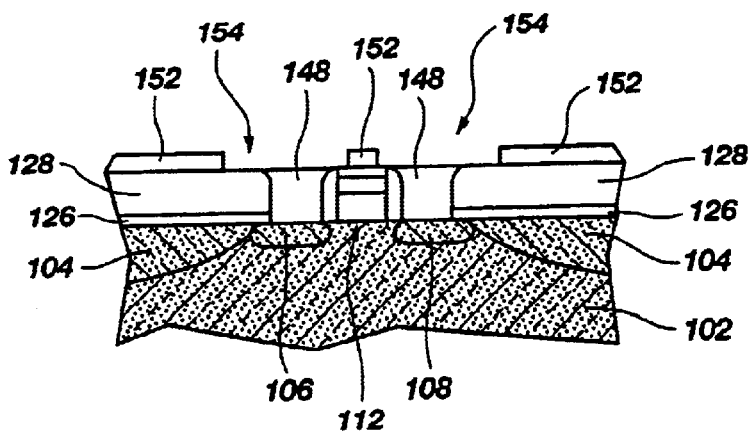
FIG. 11 is a side cross-sectional view of the structure of FIG. 10 after the patterning of a deposition mask according to the present invention.
Figure 12:
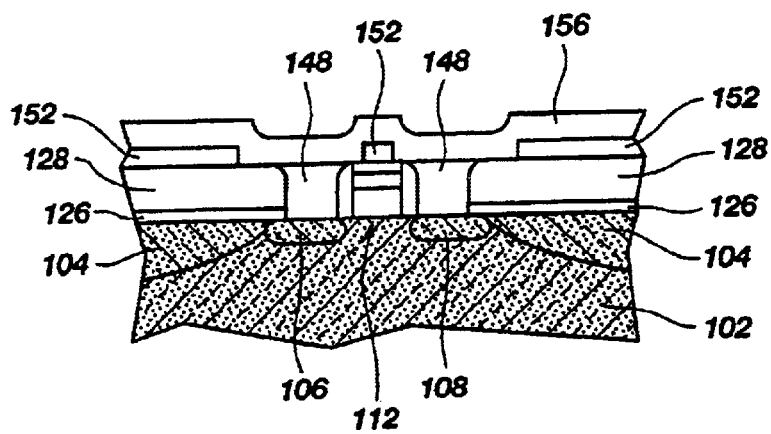
FIG. 12 is a side cross-sectional view of the structure of FIG. 11 after the deposition on a second conductive material according to the present invention.
Figure 13:
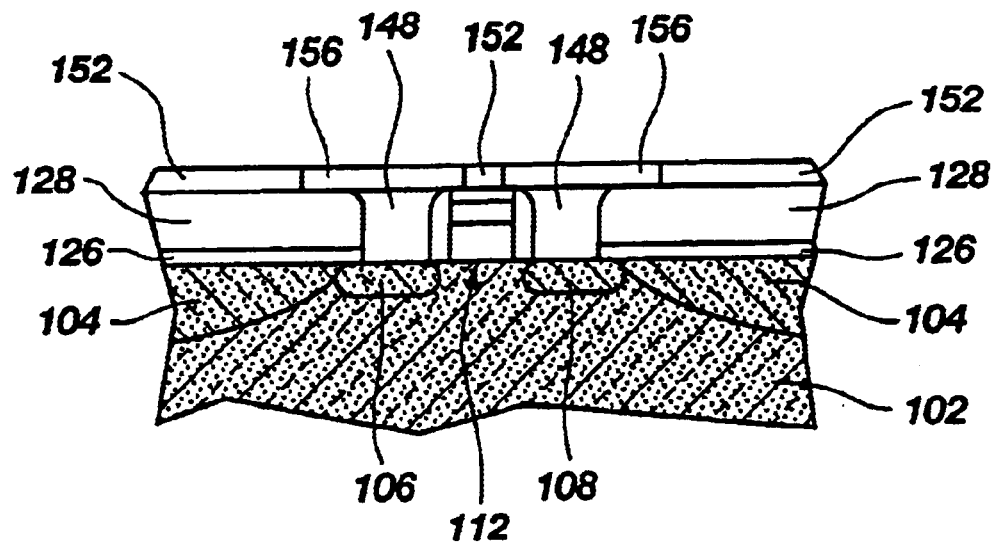
FIG. 13 is a side cross-sectional view of the structure of FIG. 12 after the planarization of the second conductive material according to the present invention.

A deposition mask 152, such as TEOS, is patterned on the second barrier layer 128 having openings 154 over the contact plugs 148, as shown in FIG. 11. The deposition mask openings 154 may be of any shape or configuration, including, but not limited to, circles, ovals, rectangles, or even long slots extending over several source regions 106 and drain regions 108, respectively. A second conductive material 156, such as n-doped polysilicon, is deposited over the deposition mask 152 to fill the deposition mask openings 154, as shown in FIG. 12. The second conductive material 156 is planarized, as shown in FIG. 13, to electrically separate the second conductive material 156 within each deposition mask opening 154 (see FIG. 11). The planarization is preferably performed using a mechanical abrasion technique, such as a CMP process. The deposition mask 152 may be removed (optional) to leave the second conductive material forming contact lands 158 on a third intermediate structure 160, as shown in FIG. 14.

Figure 14:
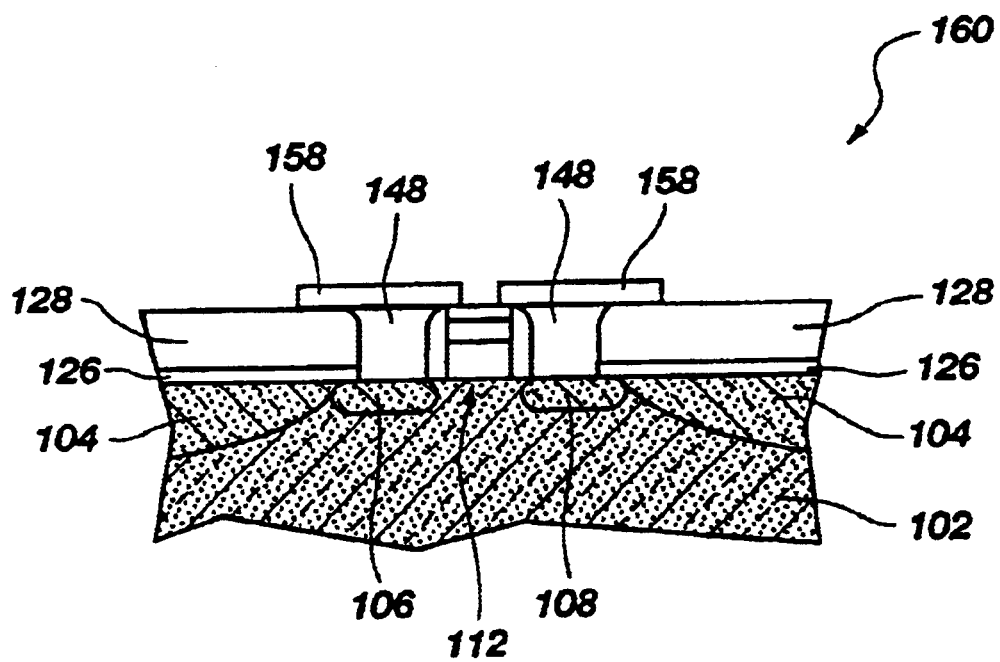
FIG. 14 is a side cross-sectional view of the structure of FIG. 13 after the removal of the deposition mask according to the present invention.
Figure 15:
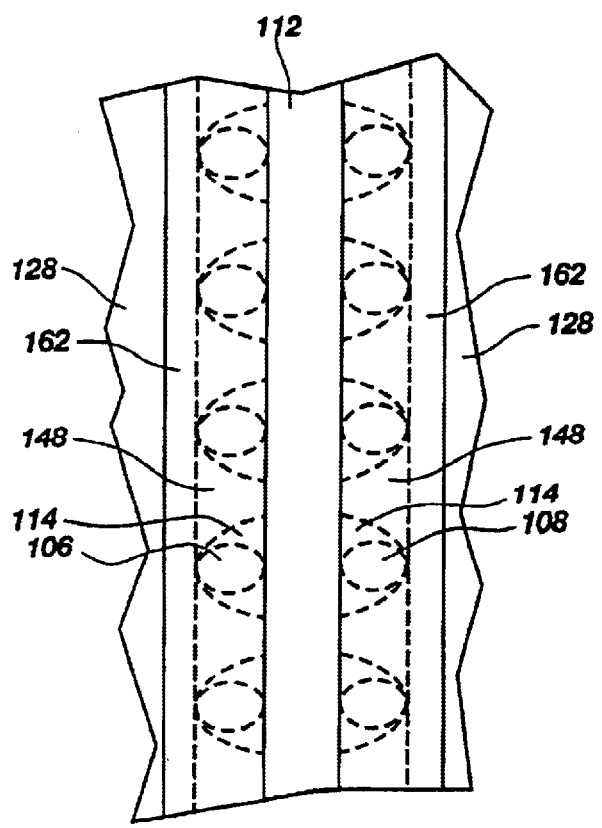
FIG. 15 is a top plan view of the structure of FIG. 14, wherein long, slot-type openings are used to form long contact lands from the second conductive material according to the present invention.
Figure 16:
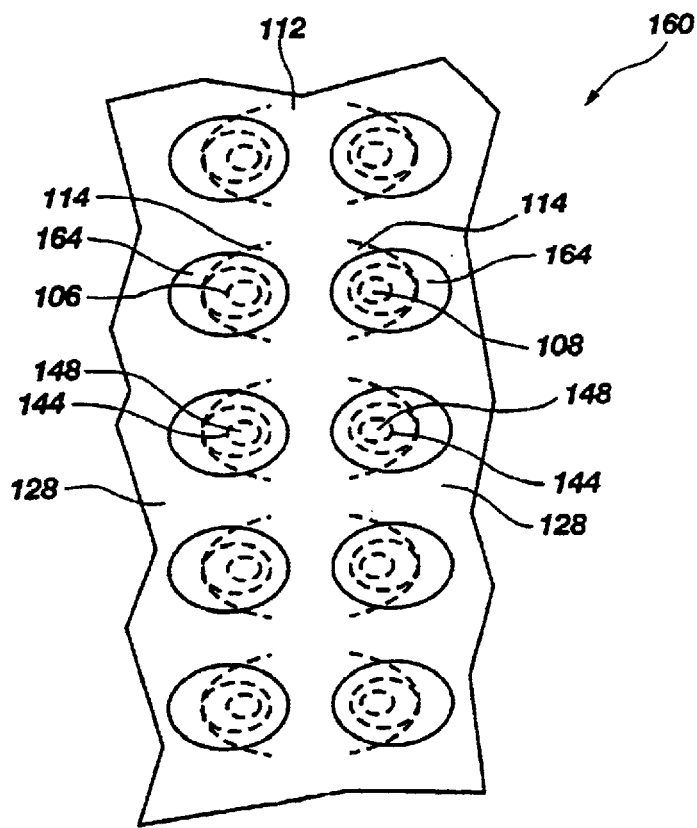
FIG. 16 is a top plan view of the structure of FIG. 14, wherein oval openings are used to form multiple, individual contact lands according to the present invention.

FIGS. 15 and 16 illustrate top plan views of the third intermediate structure 160 of FIG. 14, wherein different shape openings 154 of the deposition mask 152 (see FIG. 11) were utilized. FIG. 15 is the resulting intermediate structure 160 wherein long, slot-type openings are utilized to form long, contact lands 162 spanned over multiple source regions 106 (shown in shadow) and multiple drain regions 108 (shown in shadow), respectively (active areas 114, transistor gate members 112, and contact plugs 148 (formed in the long, slot vias 142, as shown in FIG. 7) are also shown in shadow for visual orientation). FIG. 16 is the resulting intermediate structure 160 wherein oval openings are utilized to form multiple, individual contact lands 164 atop the contact plugs 148 formed in multiple, individual vias 144, as shown in FIG. 8 (contact plugs 148, source regions 106, drain regions 108, active areas 114, and gate members 112 shown in shadow for visual orientation).

Figure 17:
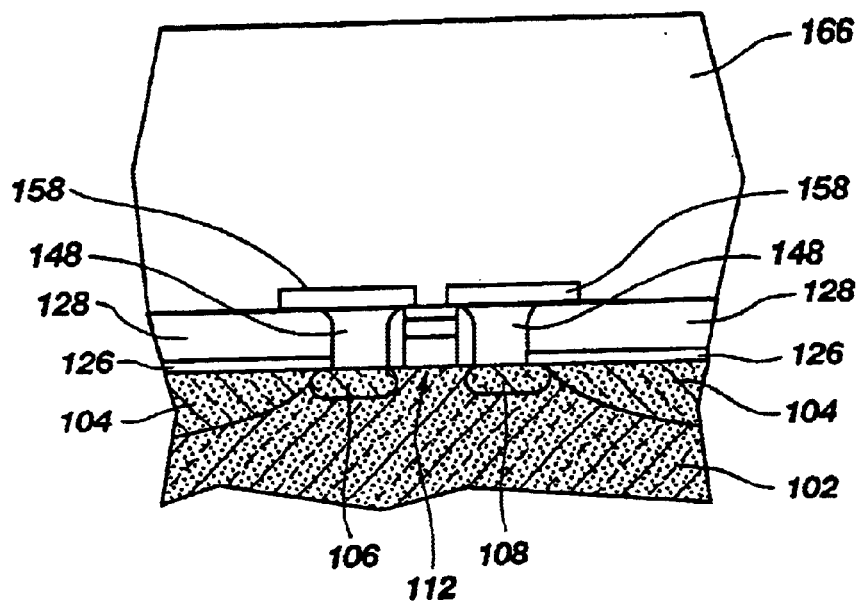
FIG. 17 is a side cross-sectional view of the structure of FIG. 14 after the deposition of a third barrier layer according to the present invention.
Figure 18:
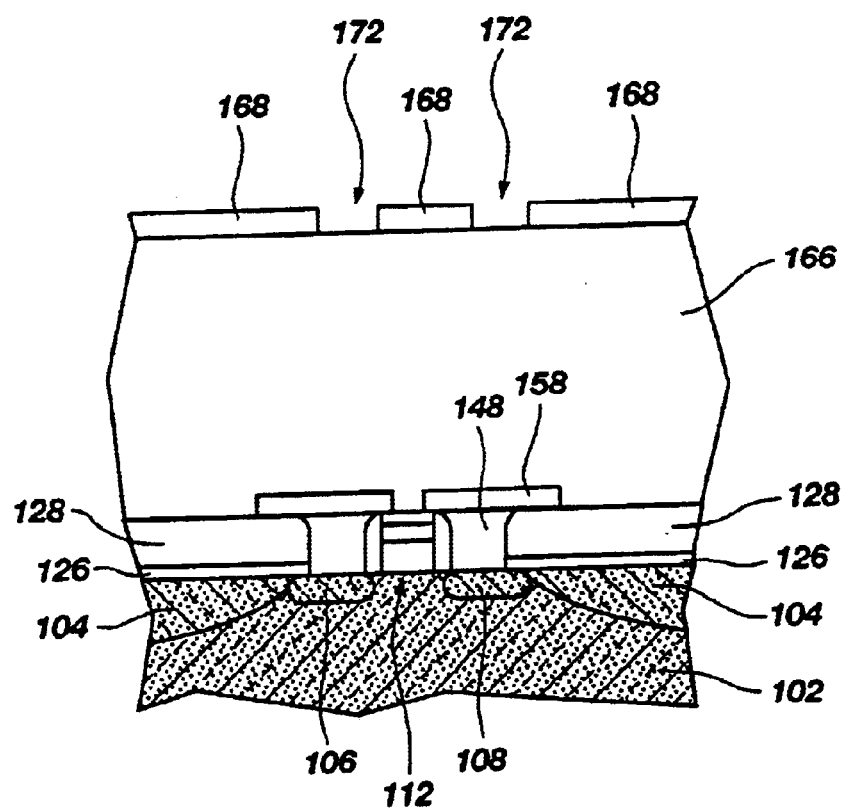
FIG. 18 is a side cross-sectional view of the structure of FIG. 17 after the patterning of a second etch mask according to the present invention.
Figure 19:
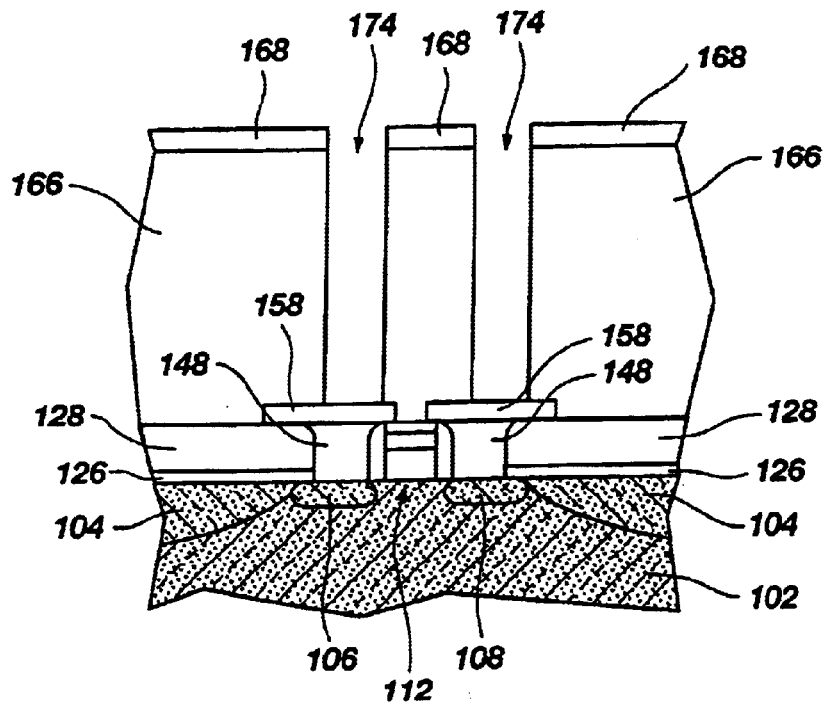
FIG. 19 is a side cross-sectional view of the structure of FIG. 18 after the etching of the third barrier layer to form contact vias according to the present invention.
Figure 20:
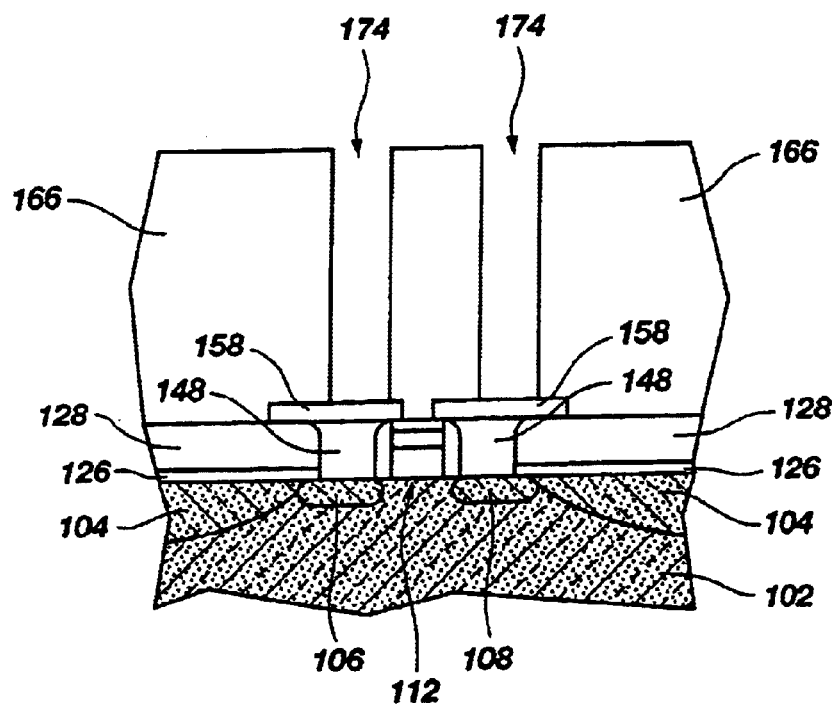
FIG. 20 is a side cross-sectional view of the structure of FIG. 19 after the removal of the second etch mask according to the present invention.

A third barrier layer 166 (preferably made of borophosphosilicate glass (BPSG), phosphosilicate glass (PSG), or the like) is deposited over the second barrier layer 128 and the contact lands 158, and, optionally, planarized, as shown in FIG. 17. A second etch mask 168, such as photoresist, is deposited on the third barrier layer 166, wherein the second etch mask 168 includes openings 172 substantially aligned over the contact lands 158, as shown in FIG. 18. The third barrier layer 166 is then etched down to the contact lands 158 to form contact vias 174, as shown in FIG. 19, and the second etch mask 168 is then removed, as shown in FIG. 20.

Figure 21:
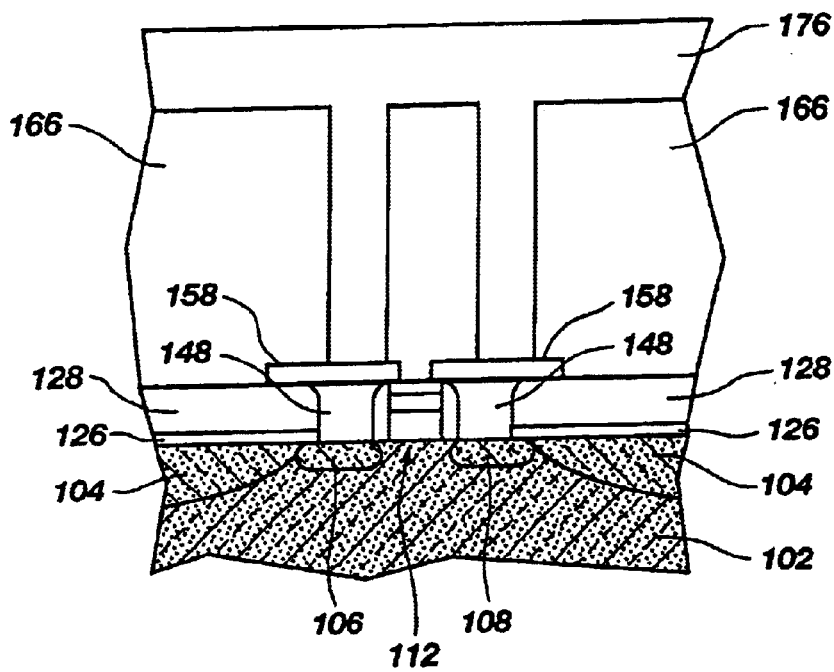
FIG. 21 is a side cross-sectional view of the structure of FIG. 20 after the deposition of a third conductive material to fill the contact vias according to the present invention.
Figure 22:
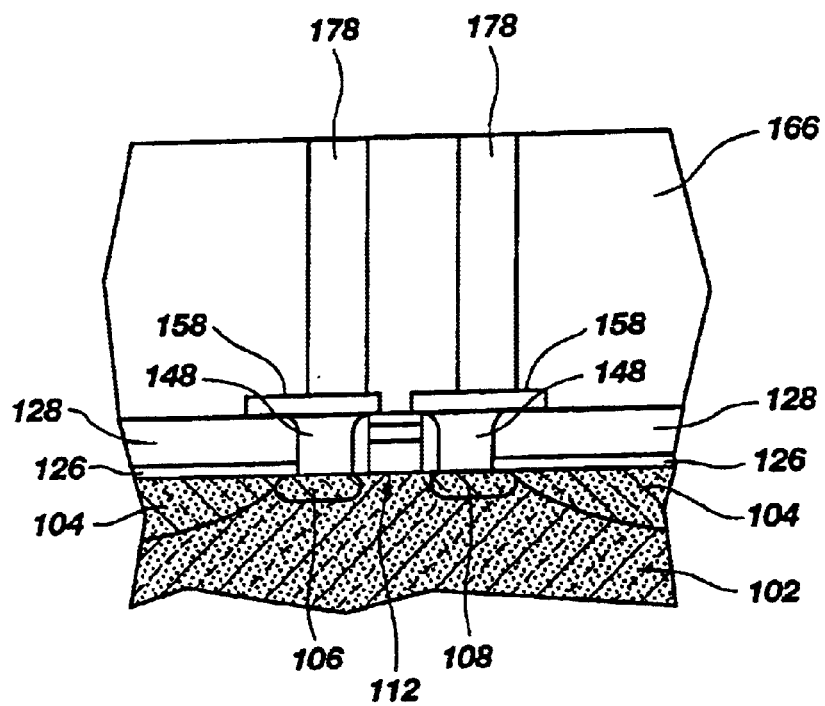
FIG. 22 is a side cross-sectional view of the structure of FIG. 21 after the planarization of the third conductive material according to the present invention.

A third conductive material 176, such as titanium nitride or tungsten, is deposited over the third barrier layer 166 to fill the contact vias 174 (see FIG. 20), as shown in FIG. 21. The third conductive material 176 is then planarized down to the third barrier layer 166, such as by a CMP method, to electrically isolate the conductive material 176 within each contact via 174 to form upper contacts 178, as shown in FIG. 22. Upper contacts 178 may extend between at least two contact lands 158.

Figure 23:
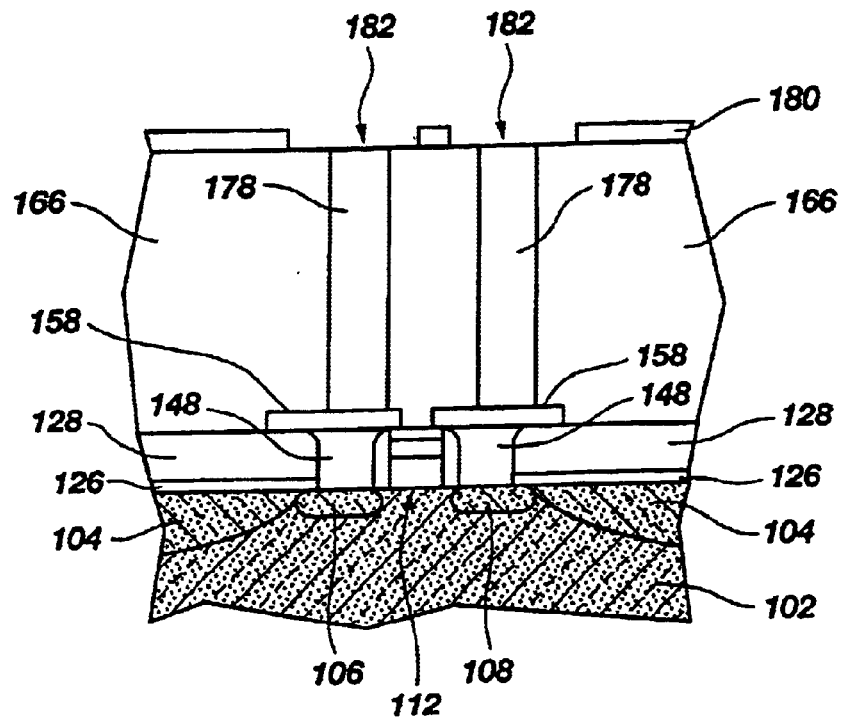
FIG. 23 is a side cross-sectional view of the structure of FIG. 22 after the patterning of a deposition mask according to the present invention.
Figure 24:
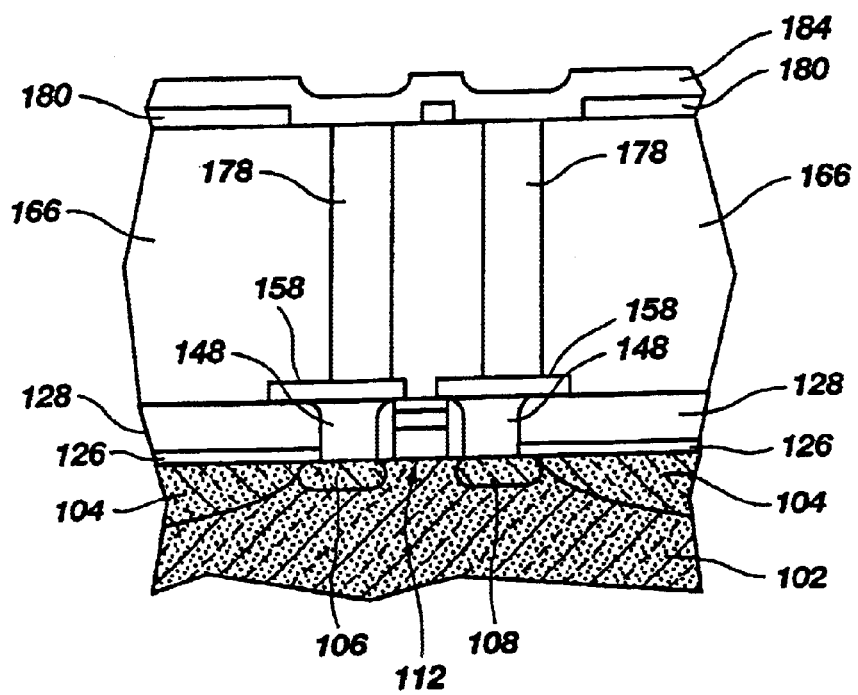
FIG. 24 is a side cross-sectional view of the structure of FIG. 23 after the deposition of a fourth conductive material according to the present invention.
Figure 25:
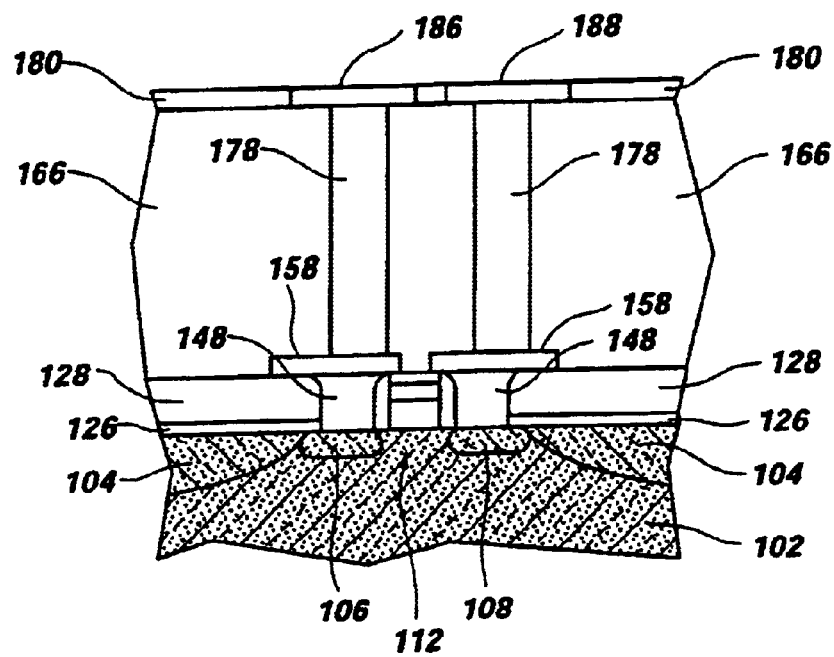
FIG. 25 is a side cross-sectional view of the structure of FIG. 24 after the planarization of the fourth conductive material according to the present invention.
Figure 26:
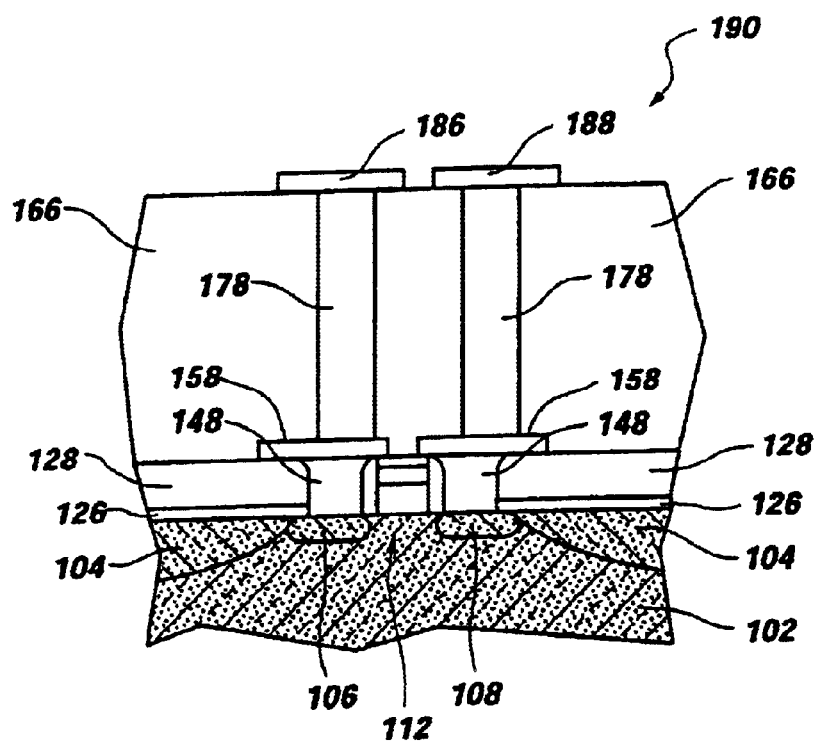
FIG. 26 is a side cross-sectional view of the structure of FIG. 25 after the removal of the second deposition mask to form a source contact metallization and a drain contact metallization according to the present invention.

A second deposition mask 180, such as TEOS, is patterned on the third barrier layer 166, having openings 182 over the upper contacts 178, as shown in FIG. 23. A fourth conductive material 184 is deposited over the deposition mask 180 to fill the deposition mask openings 182, as shown in FIG. 24. The fourth conductive material 184 is planarized, as shown in FIG. 25, to electrically separate the fourth conductive material 184 within each deposition mask opening 182 (see FIG. 23). The planarization is preferably performed using a mechanical abrasion, such as a CMP process. The second deposition mask 180 is then removed to leave the fourth conductive material forming source contact metallization 186 and a drain contact metallization 188, resulting in an ESD/EOS protection structure 190, as shown in FIG. 26.

Figure 27:
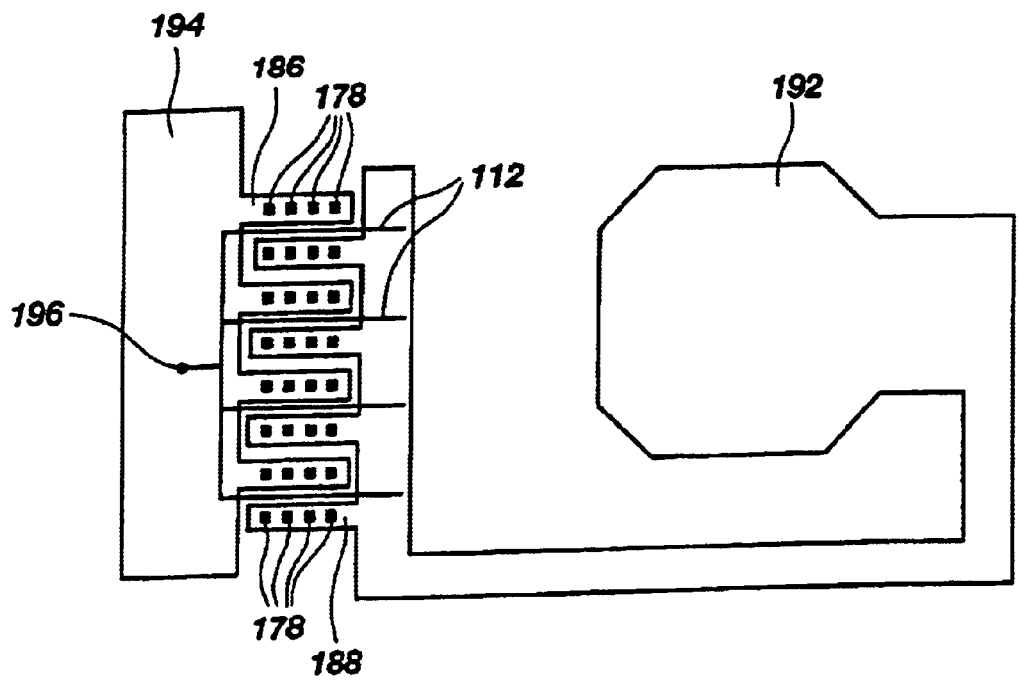
FIG. 27 is a top plan view of the source contact metallization and the drain contact metallization according to the present invention.
Figure 28:
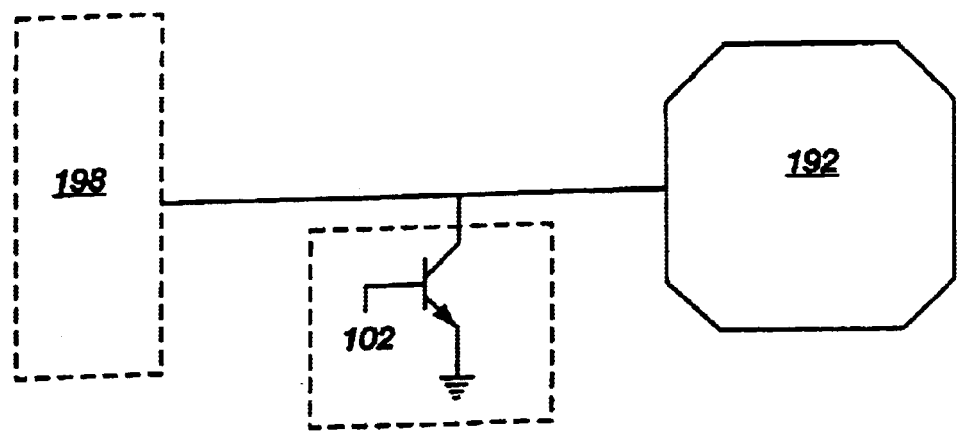
FIG. 28 is a schematic of the ESD/EOS protection structure between the drain input pad and integrated circuitry to be protected according to the present invention.
Figure 29:
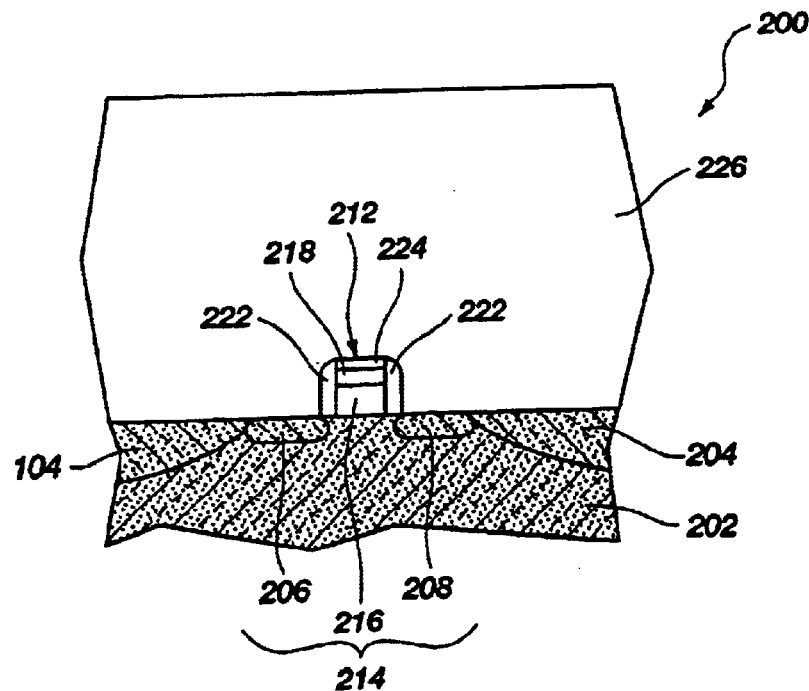
FIGS. 29–38 are side cross-sectional views of an exemplary prior art method of forming a bipolar transistor.
Figure 30:
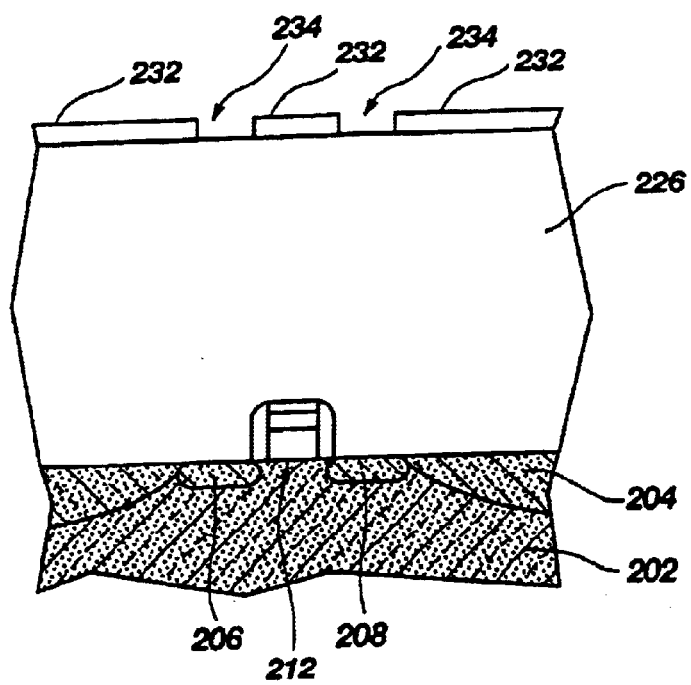
Figure 31:
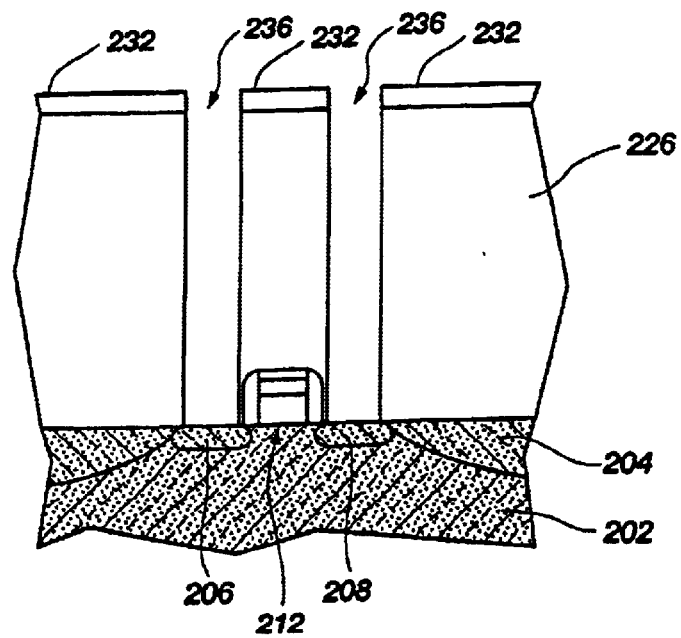
Figure 32:
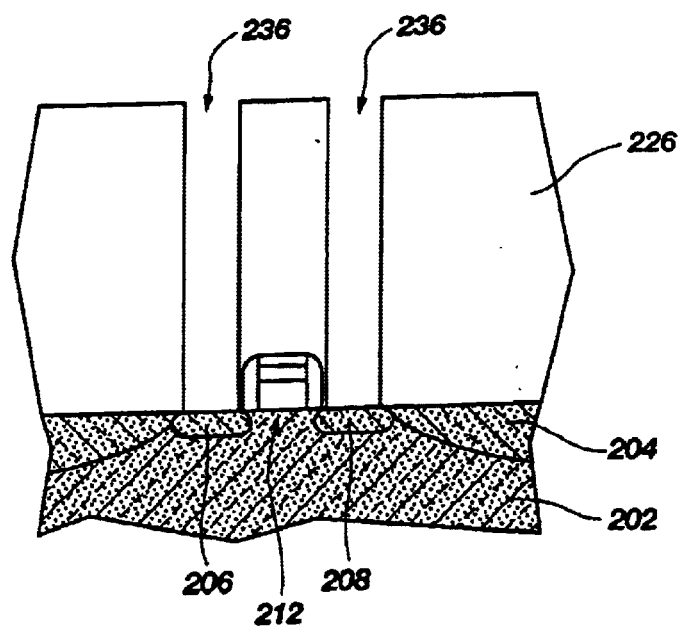
Figure 33:
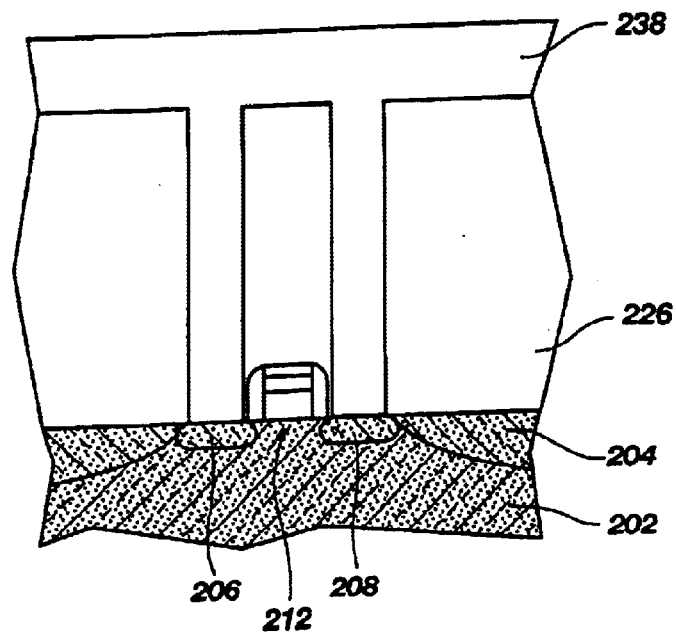
Figure 34:
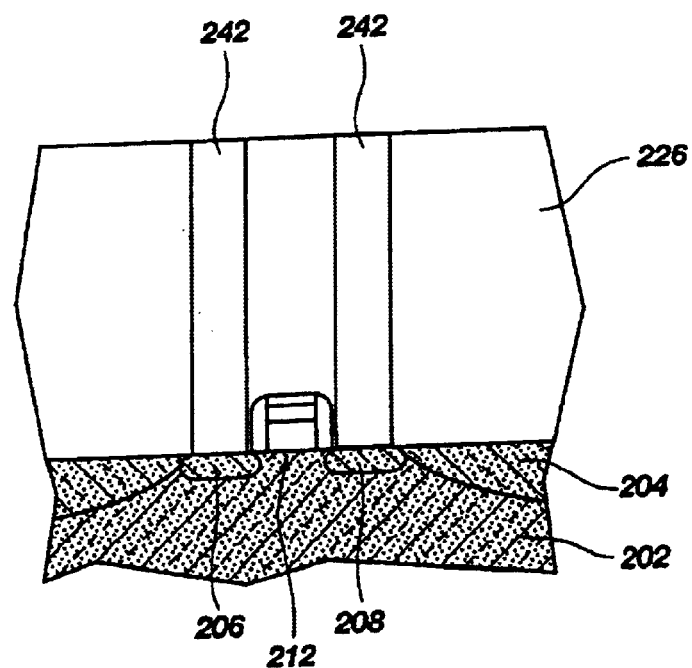
Figure 35:
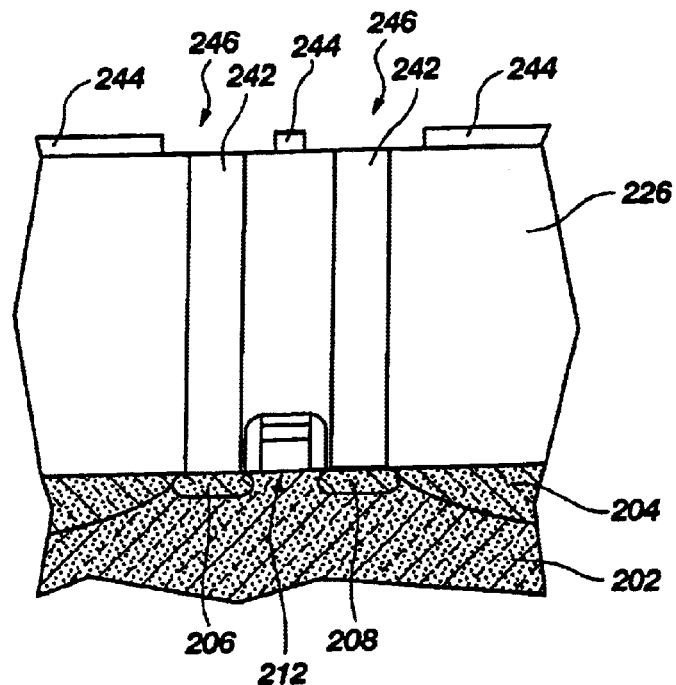
Figure 36:
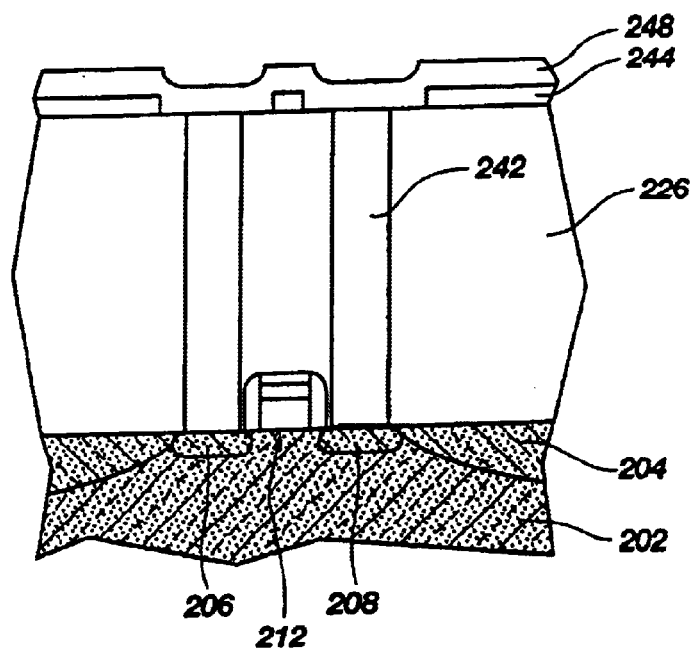
Figure 37:
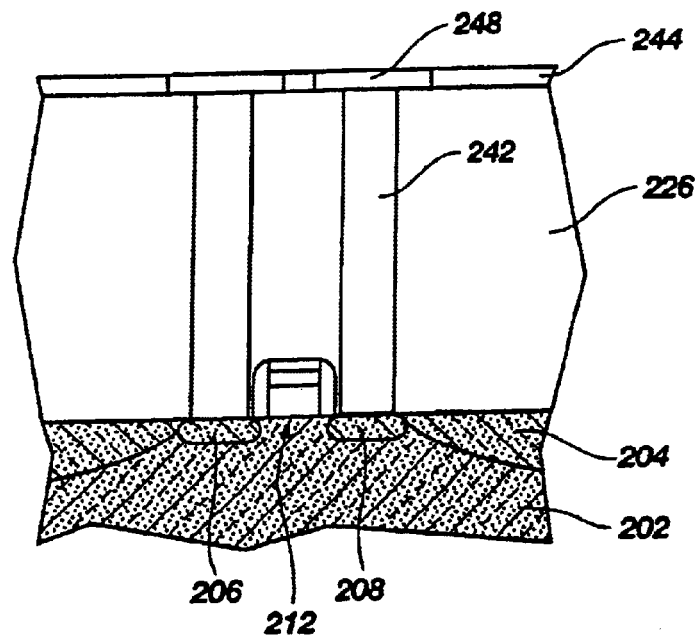
Figure 38:
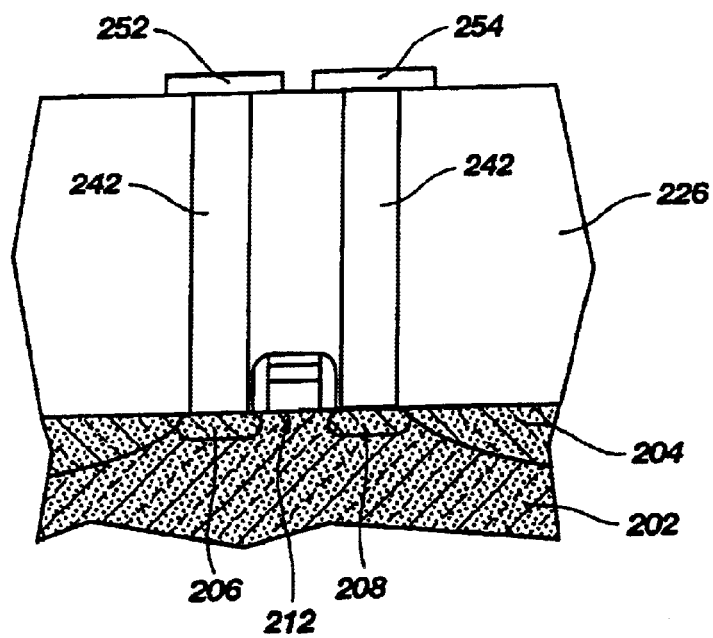
Figure 39:
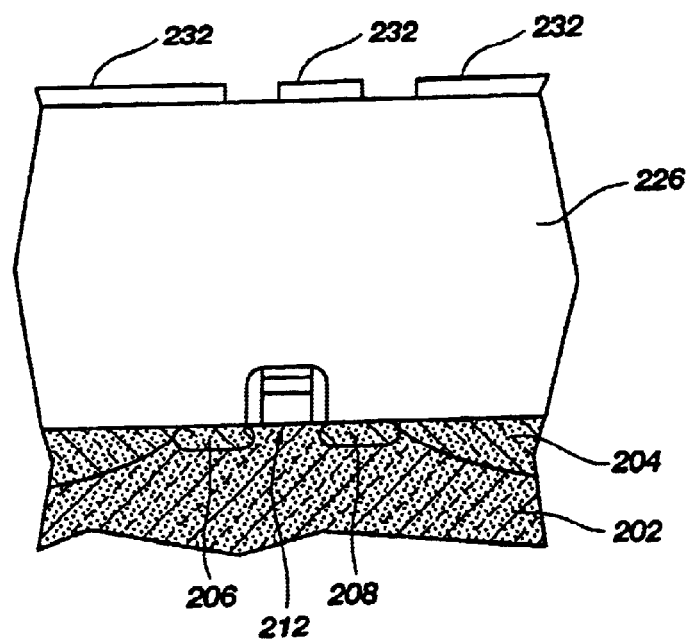
FIGS. 39–40 are side cross-sectional views of the exemplary prior art method of FIGS. 29–38 for forming a transistor wherein an etch mask is misaligned during fabrication thereof.
Figure 40:
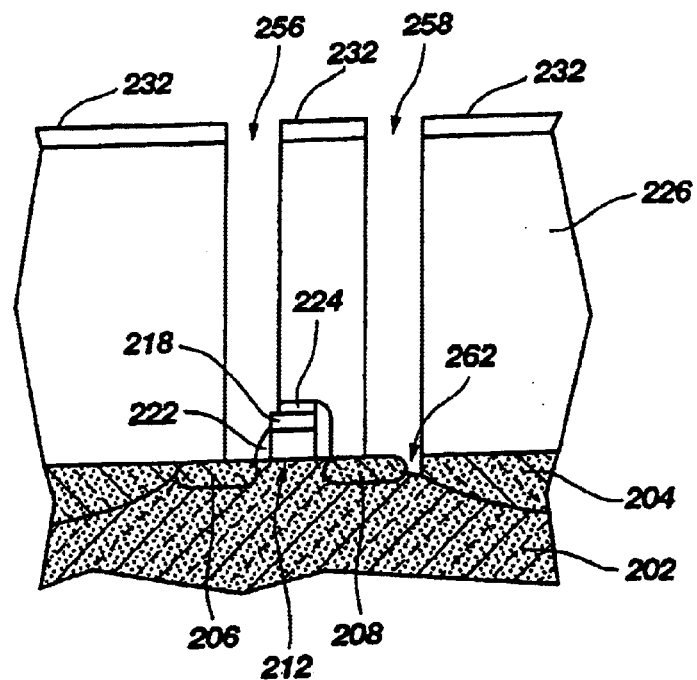

FIG. 27 illustrates a top plan view of the source contact metallization 186 and the drain contact metallization 188. The source contact metallization 186 is in electrical communication with a source plate 194 and the drain contact metallization 188 is in contact with a drain input pad 192. The transistor gate members 112 are connected to a common electrical contact 196. The transistor gate members 112 and the upper contacts 178 are illustrated for visual orientation, but it is understood that they would not be visible with a top plan view. FIG. 28 illustrates a schematic of the ESD/EOS protection structure between the drain input pad 192 and integrated circuitry 198 to be protected.

It is, of course, understood that the present invention can be used to form any contact for a semiconductor device, wherein a contact plug (such as contact plug 148) is capped with a contact land (such as contact land 158) in order to make the formation of the contact less sensitive to etch misalignments.

Having thus described in detail preferred embodiments of the present invention, it is to be understood that the invention defined by the appended claims is not to be limited by particular details set forth in the above description, as many apparent variations thereof are possible without departing from the spirit or scope thereof.

What is claimed is:

1. A method of producing a bipolar transistor for dissipation of electrostatic discharges, comprising:

providing an intermediate structure comprising a substrate having at least one thick field oxide area, and at least one active area including at least one implanted drain region, and at least one implanted source region, said intermediate structure further including at least one transistor gate member spanned between said drain region and said source region on said substrate active area;

depositing a first barrier layer substantially covering said at least one thick field oxide area, said at least one active area, and said at least one transistor gate member;

planarizing said first barrier layer to expose said at least one transistor gate member;

patterning a first etch mask on said first barrier layer, wherein said first etch mask includes openings substantially over said at least one drain region and over said at least one source region;

etching said first barrier layer to expose said at least one drain region and said at least one source region in said substrate forming at least one drain via and at least one source via, respectively;

removing said first etch mask;

depositing a layer of first conductive material over said etched first barrier layer to fill said at least one drain via and said at least one source via;

planarizing said first conductive material forming at least one drain contact plug and at least one source contact plug in said at least one drain via and said at least one source via, respectively;

patterning a first deposition material on said first barrier layer and said at least one transistor gate member, wherein said first deposition material includes individual openings over each of said at least one drain contact plugs and each of said at least one source contact plugs;

depositing a layer of second conductive material over said first deposition material to fill said individual openings over each of said at least one drain contact plugs and each of said at least one source contact plugs;

planarizing said second conductive material to said first deposition material to form an individual drain contact land over each of said at least one drain contact plugs and an individual source contact land over each of said at least one source contact plugs;

removing said first deposition material;

depositing a second barrier layer over said first barrier layer and said individual drain contact lands and said individual source contact lands;

patterning a second etch mask on said second barrier layer, wherein said second etch mask includes openings substantially over said individual drain contact lands and over said individual source contact lands;

etching said second barrier layer to expose said at least one drain contact land and said at least one source contact land forming at least one drain contact via and at least one source contact via, respectively;

removing said second etch mask;

depositing a layer of third conductive material over said etched second barrier layer to fill said at least one drain contact via and said at least one source contact via; and planarizing said third conductive material forming at least one upper drain contact and at least one upper source contact in said at least one drain contact via and said at least one source contact via, respectively.

2. The method of claim 1, further comprising:

patterning a second deposition material on said second barrier layer, said at least one upper drain contact, and said at least one upper source contact, wherein said second deposition material includes openings over said at least one upper drain contact and said at least one upper source contact;

depositing a layer of fourth conductive material over said second deposition material to fill said openings over said at least one upper drain contact and said at least one upper source contact;

planarizing said fourth conductive material to said second deposition material to form a drain contact metallization and a source contact metallization; and removing said second deposition material.

3. The method of claim 1, wherein said at least one source contact plug extends between at least two source regions.

4. The method of claim 1, wherein said at least one drain contact plug extends between at least two drain regions.

5. The method of claim 1, wherein said at least one upper source contact extends between at least two individual source contact lands.

6. The method of claim 1, wherein said at least one upper drain contact extends between at least two individual drain contact lands.

7. The method of claim 1, wherein said depositing a first barrier layer comprises depositing a first barrier layer wherein said first barrier layer is borophosphosilicate glass (BPSG), borosilicate glass (BPG), or phosphosilicate glass (PSG).

8. The method of claim 1, wherein said depositing a second barrier layer comprises depositing a second barrier layer wherein said second barrier layer is borophosphosilicate glass (BPSG), borosilicate glass (BPG), or phosphosilicate glass (PSG).

\* \* \* \* \*